United States Patent
Curatolo et al.

(10) Patent No.: US 9,626,457 B2
(45) Date of Patent: Apr. 18, 2017

(54) METHOD FOR REAL TIME COMPUTATION OF THE STATE VARIABLES OF A HYBRID DIFFERENTIAL-ALGEBRAIC PROCESS MODEL

(75) Inventors: Daniel Curatolo, Oberhausen (DE); Marcus Hoffmann, Oberhausen (DE); Benno Stein, Paderborn (DE)

(73) Assignee: Art Systems Software GmbH, Paderborn (DE)

( * ) Notice: Subject to any disclaimer, the term of this patent is extended or adjusted under 35 U.S.C. 154(b) by 249 days.

(21) Appl. No.: 13/501,363

(22) PCT Filed: Oct. 6, 2010

(86) PCT No.: PCT/EP2010/006094
§ 371 (c)(1),
(2), (4) Date: May 24, 2012

(87) PCT Pub. No.: WO2012/045321
PCT Pub. Date: Apr. 12, 2012

(65) Prior Publication Data
US 2012/0232866 A1   Sep. 13, 2012

(51) Int. Cl.
*G06F 17/50* (2006.01)
*G06F 17/13* (2006.01)

(52) U.S. Cl.
CPC .............. *G06F 17/50* (2013.01); *G06F 17/13* (2013.01)

(58) Field of Classification Search
CPC ...... G06F 17/5036; G06F 17/12; G06F 17/13; G06F 17/50; F16D 2500/3165;

(Continued)

(56) References Cited

U.S. PATENT DOCUMENTS 7,603,219 B2 * 10/2009 Joshi et al. ............... 701/68
2004/0098185 A1 * 5/2004 Wang ....................... 701/70

(Continued)

OTHER PUBLICATIONS

Smith, J.M., (Transparent Concurrent Execution of Mutually Exclusive Alternatives, In 9th International Conference on Distributed Computing Systems, Newport Beach, CA, Jun. 1989,).*

(Continued)

*Primary Examiner* — Kamini S Shah
*Assistant Examiner* — Brian S Cook
(74) *Attorney, Agent, or Firm* — David S. Safran (57) ABSTRACT

Method for real time computation of the state variables of a hybrid differential-algebraic process model (DAP) in succeeding time steps on a process computer with a process interface, the process computer detecting at least one process variable of a physical process and/or producing output for influencing the physical process, the hybrid DAP being solved at least by a integrator functionality, a condition evaluation functionality and identification of a condition change by a consistency detection functionality for structure decision variables, and depending on the result parts of the hybrid DAP being active or inactive. Prompt computation is possible when a condition of the hybrid DAP changes by the consistency detection functionality being carried out in a sorted consistency handling function (KHF), in the case of a condition change, first and third parts of the sorted KHF being carried out once and a second part thereof being carried out repeatedly.

2 Claims, 4 Drawing Sheets

(58) Field of Classification Search
CPC . F16D 2500/70264; F16D 2500/70605; F16D 2500/7082; F16D 48/06; B60T 8/1706; B60T 8/17555
USPC .................................................. 703/6, 7, 8, 2
See application file for complete search history.

(56) References Cited

U.S. PATENT DOCUMENTS

2004/0220786 A1* 11/2004 Tiwari et al. ..................... 703/2
2013/0080013 A1* 3/2013 Kobayashi et al. ............ 701/70

OTHER PUBLICATIONS

Le cun, B., Concurrent Data Structures for Three Search Algorithms, Parallel Algorithms for Irregular Problems: State of the Art, 135-155, 1995 Kluwer Academic Publishers.*
Diehl et al. (Real-time Optimization and Nonlinear Model Predictive Control of Processes Governed by Differential-algebraic Equations, Journal of Process Control 12 92002) 577-585.*
Simulink-Stateflow Technical Examples: Using Simulink and Stateflow in Automotive Applications, 1998.*
Mehrmann (Simulation and Control of Switched Systems of Differential-algebraic Equations, 2010).*
Nikoukhah, A hybrid system formalism for modeling and simulation, proceedings of the 2006 IEEE conference on computer aided control systems design munich, germany, Oct. 4-6, 2006.*
Sasaki Parallelism in algebraic computation and prallel algorithms for symbolic (linear systems, proceedings of the 1981 ACM symposium on symbolic and algebraic computation.*
Venu Satuluri, A survey of parallel algorithms for classification, Mar. 15, 2007.*
Zackrisson, T., Modeling and Simulation of a driveline with an automatic gearbox, Dec. 2003 IR-RT-EX-0320.*
Iauer, F., From Support Vector Machines to Hybrid System Identification présentée et soutenue publiquement le 1er octobre 2008 pour l'obtention du Doctorat de l'Université Henri Poincaré— Nancy 1 spécialité automatique.*
Lumsdaine (Theorectical and Practical Aspects of Parallel Numerical Algorithms for Initial Value Problems, with Applications, RLE Technical Report No. 574, Sep. 1992).*
Mehrmann_2009, Mehrmann, V., Wunderlich, L., Hybrid Systems of Differential-algebraic Equations—Analysis and Numerical Solution, Journal of Process Control 19 (2009) 1218-1228.*
Zimmer_2010, Zimmer, D., Equation-Based Modeling of Variable-Structure Systems, Swiss Federal Institute of Technology, Zurich, Diss. ETH No. 18924.*
Banker_1999, Banker, R.D. (1999). "Evaluating Contextual Variables Affecting Productivity using Data Envelopment Analysis," paper presented at the Sixth European Workshop on Efficiency and Productivity Analysis, Copenhagen, Oct. 29-31.*
Hamann_2008, Hamann, P., Mehrmann, V., Numerical Solution of Hybrid Systems of Differential-algebraic Equations, Comput. Methods Appl. Mech. Engrg. 197 (2008) 693-705.*
Volker Mehrmann, Lena Wunderlich, Hybrid Systems of Differential-Algebraic Equations-Analysis and Numerical Solution, https://opus4.kobv.de/opus4-matheon/files/536/5417_MehW08a_preprint.pdf; pp. 1-19.

\* cited by examiner

METHOD FOR REAL TIME COMPUTATION OF THE STATE VARIABLES OF A HYBRID DIFFERENTIAL-ALGEBRAIC PROCESS MODEL

BACKGROUND OF THE INVENTION

Field of the Invention

The invention relates to a method for real time computation of the state variables of a hybrid differential-algebraic process model (DAP) in succeeding time steps on a process computer with a process interface, the process computer being set up such that, via the process interface, at least one process variable of a physical process can be detected and/or one output for influencing the physical process can be output by the process computer, the hybrid DAP being solved at least by one integrator functionality, one condition evaluation functionality and with identification of a condition change by a consistency detection functionality for structure decision variables, and depending on the structure decision variables parts of the hybrid DAP being active or inactive.

Description of Related Art

Process computers and methods of the above described type which are to be executed on process computers are quite generally used in technical problem formulations to specifically observe a physical process and/or to specifically affect this physical process in order to influence it in the desired manner. Often process models—therefore functional physical-technical relationships which can be described by mathematical equations—are implemented on these process computers, and for example, for control purposes constitute a mathematical model of the linked physical process, or mathematically simulate a process which is different from the linked physical process and which simulates a part of reality, for example, for excitation of the "real" physical process, as is known, for example, for simulators. These process computers and methods especially from the domain of control device development (rapid control prototyping, hardware-in-the-loop tests) can no longer be dispensed with.

Depending on the type of process which is to be computed and modeled on the process computer, the process model has different mathematical properties. Many process models consist of a system of linear or nonlinear differential equations, in the simplest case of a single differential equation. These differential equations are solved with the known numerical methods, hereinafter called integrator functionality.

Since the process computer is conventionally joined to a real physical process, it is necessary to compute the process model in real time so that process variables of the linked physical process can be detected and further processed in the desired time reference—defined by the succeeding time steps on the process computer—and outputs for influencing the physical process can be output from the process computer.

Many process models in addition to differential equations or differential equation systems also comprise algebraic equations which typically describe the behavior of conservation quantities in the process. Simple relationships of this type are, for example, currents in nodes of an electrical network, the energy constancy in a closed system, the volume flow of an incompressible medium, the conservation of momentum in a multibody system and other secondary kinetic conditions. These models are called differential-algebraic process models, hereinafter "DAP" for short.

DAP are often structurally-invariant, i.e., they fix the state variables of the process model and the relationships between the state variables a priori, the mathematical framework as such does not change, neither over time nor depending on other conditions. These systems can be transferred into a complete algorithmic model—for example in the form of C-code—due to their structural invariance before the running time of the computation, and before the start of computation the structurally-invariant models can be optimized with the known mathematical methods for minimizing computation effort, therefore for example by BLT transforms, tearing or sparse-matrix methods. From the running time-optimized algorithmic model, then, a process model which can be executed on the process computer can be prepared, therefore, for example, by completion of the above cited C-code.

More complex process models are, however, often structurally variant, they have different modes which are characterized in that, for example, different combinations of state variables or different relationships between a choice of state variables which remains the same describe the functionality of the process model, these different modes of the process model being activated or deactivated depending on certain conditions. The quantities which decide whether a hybrid DAP undergoes a structure change are called structure decision variables here; structure decision variables are usually discrete variables whose values change depending on condition equations, the condition equations being evaluated by the initially mentioned condition evaluation functionality. A structurally variant differential-algebraic model is called a hybrid DAP. Depending on the structure decision variables of the process model therefore different parts of the hybrid DAP are activated or deactivated so that a certain mode of the hybrid DAP is less complex (in the sense of comprehensive) than the hybrid DAP which is omnipotent and encompasses all possible modes, therefore possible active structures of the hybrid DAP.

In order to be able to compute the mode of a hybrid DAP, known computation methods have an integrator functionality, therefore, a conventional numerical integrator for solving differential equations.

Within the scope of the condition evaluation functionality condition equations are evaluated, as a result of which structure decision variables can change. As a result of the change of a structure decision variable—or the change of several structure decision variables—the mode of the process model can change, but it is only one necessary prerequisite for a mode change.

One example for a hybrid DAP could be a motor with the pertinent gear train, the different gear stages being different structures of the hybrid DAP, of which, for example, only one gear stage can ever be active. Structure decision variables in this connection could be dependent, for example, on the engine speed, the power demands of the driver and the mechanical load on the transmission. Depending on these structure decision variables, it is decided whether there is a structure change or not within one computation step or from one computation step to the next computation step.

The condition evaluation functionality alone does not guarantee that a stable set of structure decision variables—more exactly a stable set of values for the structure decision variables—is found, for this purpose the initially mentioned consistency detection functionality is used. The consistency detection functionality is optionally iteratively executed, consistency of the structure decision variables being present when the structure decision variables—more exactly: the values for the individual structure decision variables—no longer change. This consistency detection functionality is always executed when the condition evaluation functionality has recognized the change of at least one structure decision variable. Within the consistency detection functionality the values computed beforehand for the state variables and the time are "fixed", the derivations of the state variables, algebraic variables and the condition equations are however always re-evaluated again, finally its always being determined whether the values which have been determined beforehand for the structure decision variables are in agreement with the newly determined values for the structure decision variables. If this is the case, the consistency checking ends, and if this is not the case, the consistency checking must be continued until a stable state is achieved, in the ideal case. In practice, the iteration must be aborted if consistency is not achieved, then other procedures take effect which, however, are not the subject of the examination. During execution of the consistency detection functionality, as a result of the change of the structure decision variables, changing portions of the hybrid DAP can have become active, the consistency check therefore presupposes that the complete hybrid DAP is available to it.

In a further step, it can be determined at what instant exactly the structure decision variable has assumed another value—the evaluation of a condition equation has therefore led to another result—which can cause a structure change of the hybrid DAP. This instant can lie anywhere in the computation interval between two discrete computation instants. The computation of the condition evaluation function is generally based on equations or inequalities by whose evaluation structure decision variables are changed. Mathematically, the zero crossing of a function is determined here, the instant $t_c$ of the zero crossing of this function corresponding to the instant of the condition change. If this instant $t_c$ of the condition change is known, the consistency detection functionality is started which is designed to determine at time $t_c$ of the condition change that set of structure decision variables or values of structure decision variables which is stable and first of all does not entail any further change. For this purpose the entire hybrid DAP must always be recomputed at least once.

It is clearly apparent from the described procedure that, when a condition change is recognized within one computation step, at least one additional integration of the hybrid DAP is necessary compared to the "normal" integration of the active part of a hybrid DAP when there is no change of condition. If, as described above, back computation to the exact instant between two computation steps takes place, in the case of a condition change, at least one another—therefore—third integration of the hybrid DAP is also necessary. It is immediately illuminating that this additional effort can lead to major problems within the real time computation since the added time consumption may be so high that within the desired time reference—duration of the sampling period of the real time computation—a computation is not possible and the time is exceeded which can have serious consequences in the systems which are examined here and which have a direct relationship via the process interface to a physical process. The running time behavior of the real time computation of the state variables of hybrid DAPs is difficult to calculate in the above described method, the computation time in the case of a condition change of the hybrid DAP can exceed the computation time by several times without a condition change being present.

SUMMARY OF THE INVENTION

Therefore, the object of this invention is to provide a method for computing the state variables of a hybrid DAP with which prompt computation is possible, even when a condition of the hybrid DAP changes, and in any case, so that the necessary computation time in the case of the change of a structure decision variable is reduced compared to the known method.

The derived and described object is achieved in the above explained method for computing the state variables of a hybrid differential-algebraic process model in that the consistency detection functionality is carried out in a sorted consistency handling function (KHF), a first part of the sorted KHF comprising all condition-independent portions of the hybrid DAP, a second part of the sorted KHF comprising all condition-dependent portions of the hybrid DAP which influence the structure decision variables, a third part of the sorted KHF comprising all condition-dependent portions of the hybrid DAP which do not influence the structure decision variables, in the case of a condition change for detection of consistent set of structure decision variables the first part and the third part of the sorted KHF being carried out only once and only the second part of the structured KHF optionally being carried out repeatedly, with each execution of the integrator functionality the sorted KHF also being carried out.

In the method in accordance with the invention, the traditional division between the integrator functionality which is applied to all equations of the hybrid DAP and the condition evaluation functionality, accompanied by the consistency detection functionality in the case of the change of the structure decision variable, in which again at least once the entire hybrid DAP is evaluated, are omitted. By sorting large parts of the complete hybrid DAP and its computation in the consistency handling function, moreover, unnecessary multiple calculations of large parts of the hybrid DAP is avoided. The first part of the sorted KHF is carried out in each computation step, the result of computing the first part of the KHF is, moreover, independent of whether there is a condition change since the first part of the sorted KHF comprises all condition-independent portions of the hybrid DAP.

The second part of the sorted KHF is decisive for whether a condition change of the hybrid DAP is present or not since, in this second part of the sorted KHF, all condition-dependent portions of the hybrid DAP are normally combined which, for their part, can also influence structure decision variables, and therefore, are defining for how structure decision variables develop. This second part of the sorted KHF can, accordingly, be computed and optionally repeatedly computed when there is a condition change, and that, henceforth, an active set of structure decision variables or values of structure decision variables of the hybrid DAP which is consistent and stable can be computed. The stability of the set of structure decision variables or of the values of structure decision variables is recognized by the values not changing from one to the next iteration step of the second part of the KHF. In the case of a condition change, therefore, iteration is necessary only over the second part of the sorted KHF and not, as is known in the prior art, over the complete hybrid DAP and the complete consistency detection functionality. This characteristic results in a considerable savings of time compared to the conventional method.

The third part of the sorted KHF can only be computed once in each computation step—exactly like the first part of the sorted KHF, since beforehand, therefore, in the computation of the second part of the sorted KHF, the now stable set of structure decision variables has been determined and the following computation of all condition-dependent portions of the hybrid DAP which, however, do not normally influence structure decision variables can no longer lead to a change of condition equations, and thus, also no longer to a change of structure decision variables and therefore, the structure of the hybrid DAP.

According to one preferred configuration of the method in accordance with the invention, in the second part of the sorted consistency handling function, the portions of the hybrid DAP are divided into causal chains of structure decision variables. This means that, when a certain structure decision variable changes, only those parts of the hybrid DAP or the other condition equations are evaluated on which this change of the structure decision variable has any effect at all. In this way, causal chains are formed so that only those causal chains are recomputed in which structure decision variables have changed. Because, when the sorted consistency handling function is carried out, iteration is done at this point only over a still more special and thus smaller part, so that a still greater time gain compared to conventional methods is achieved.

The invention is furthermore directed at a computer program with program code means to carry out all method steps in accordance with the invention which have been completed using the aforementioned process computer when the program is carried out on a data processing system. The invention is also directed at this computer program with program code means which are stored on a computer-readable data medium.

The method in accordance with the invention for computation of the state variables of a hybrid differential-algebraic process model is explained below using the following description of one exemplary embodiment in conjunction with the drawings.

DETAILED DESCRIPTION OF THE INVENTION

Figure 1:
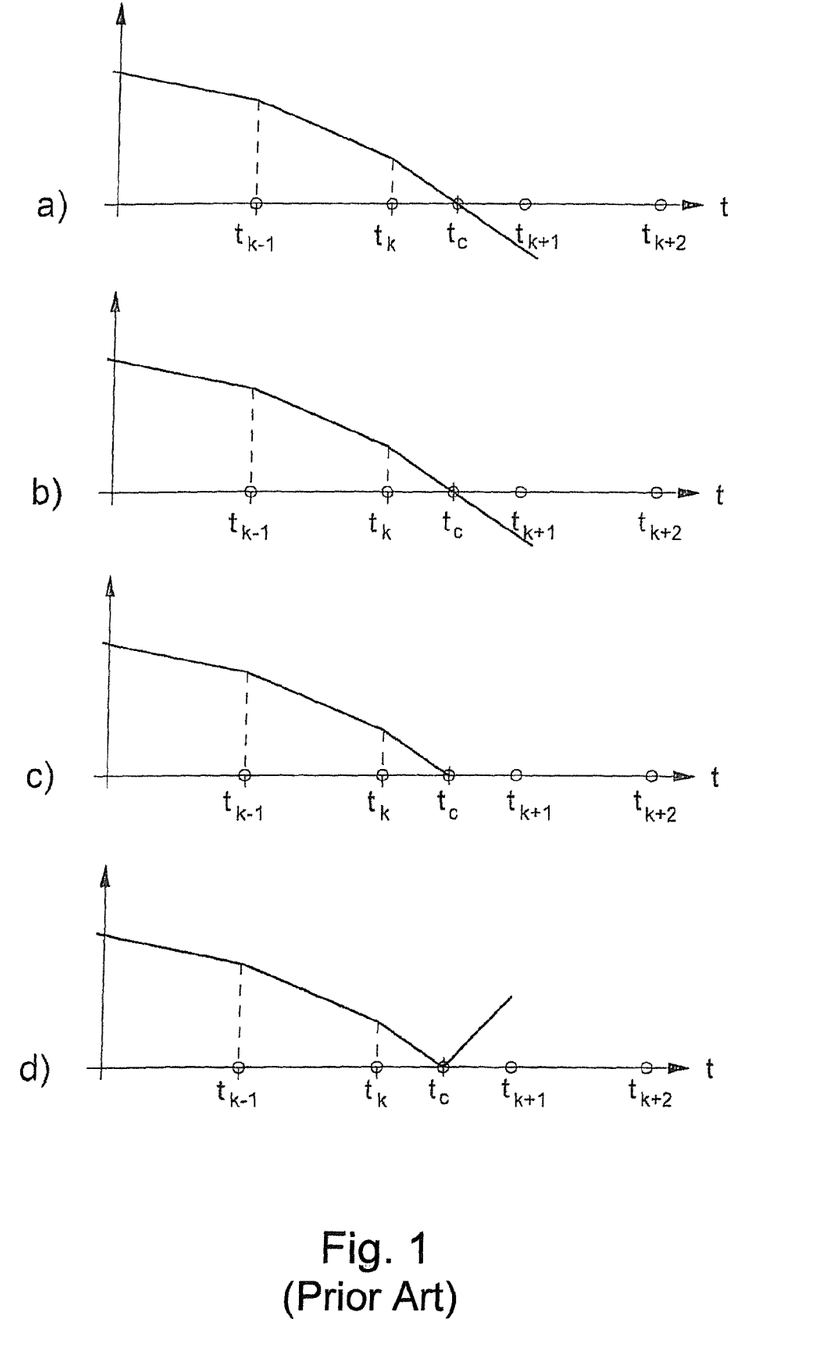
FIG. 1 shows the procedure known from the prior art for detecting the state variables of a hybrid DAP.
Figure 2:
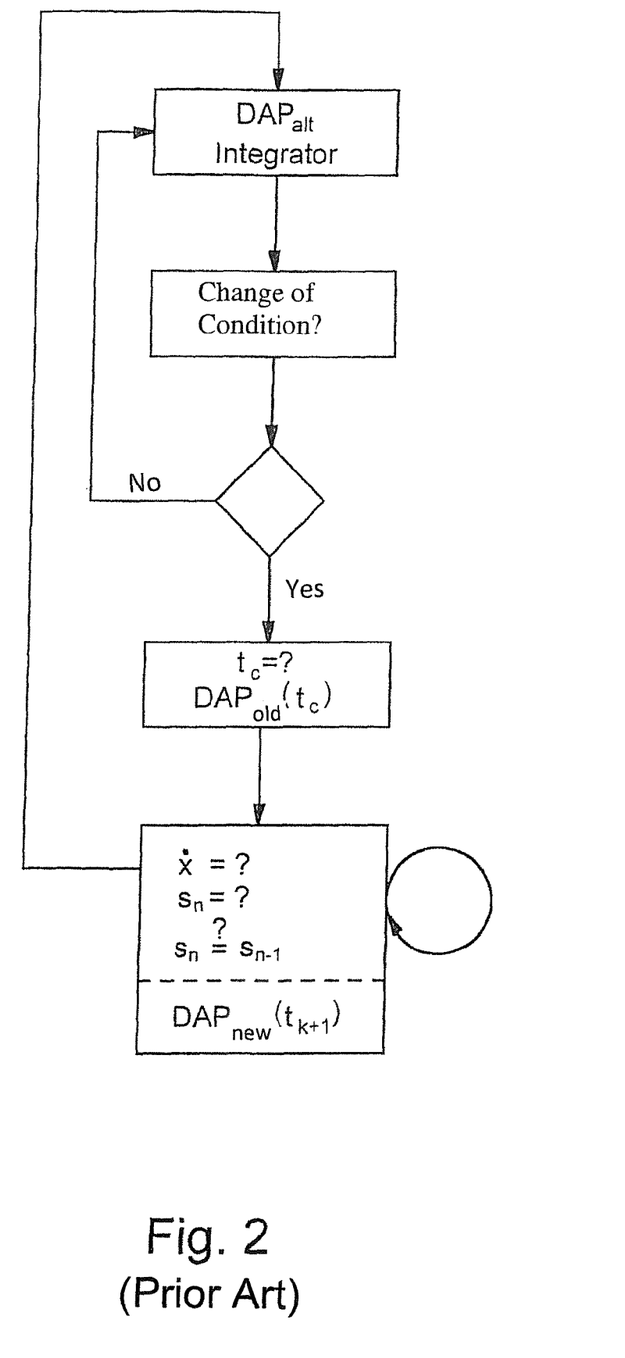
FIG. 2 shows the flow chart of a conventional method for computing the state variables of a hybrid DAP.

FIGS. 1 and 2 show different aspects of known methods for computing the state variables of a hybrid differential-algebraic process model (DAP), FIG. 1 showing successive, equidistant computation intervals which are each bordered by instants $t_{k-1}$, $t_k$, $t_{k+1}$, etc. As was described initially, hybrid DAPs are characterized in that the active parts of the hybrid DAP can vary depending on the structure decision variables s.

In order to be able to recognize a condition change and concomitantly a possible structure change within the hybrid DAP, methods known from the prior art for computing the state variables of a hybrid DAP are provided with a condition evaluation functionality which first detects that any change at all in the evaluation of a condition equation has taken place.

Furthermore, known methods are also provided with a consistency detection functionality which is able to determine stable values of structure decision variables; this is shown in FIGS. 1a) to 1d).

The graph of a condition equation of the hybrid DAP is plotted over the time axis t; there is a condition change when it crosses zero so that the zero crossing can be detected for ascertaining a condition change. This zero crossing is present here in the computation interval from time $t_k$ to time $t_{k+1}$. Since the equations of the hybrid DAP are conventionally evaluated only at discrete instants $t_{k-1}$, $t_k$, $t_{k+1}$, the exact instant $t_c$ of zero crossing of the condition equation must be determined over known iteration techniques for zero point determination (FIG. 1b)). The detection of the zero crossing of the condition equation shown in FIG. 1a) is the task of the condition evaluation functionality.

If the instant $t_c$ is known at which a condition change has taken place, it must be subsequently determined which values become stable and consistent for the structure decision variables, and it can be necessary in this step to repeatedly compute the complete hybrid DAP—condition equations and derivations of the state variables—until a stable change state of the hybrid DAP is found in which therefore the structure decision variables no longer change (FIG. 1c). Based on the change of the structure decision variable or several structure decision variables, other parts of the hybrid DAP can take effect, but need not do so; the change of a structure decision variable is a necessary, but not a sufficient condition for a structure change. If the new active part of the hybrid DAP has been stably determined, further integration of the now active part of the hybrid DAP takes place in the intermediate step range from $t_c$ to time $t_{k+1}$ (FIG. 1d)).

With the known computation techniques, if a condition change is detected in one computation step of the hybrid DAP, in addition to the integration of the active part of the hybrid DAP which is otherwise always necessary, at least one further evaluation of the entire hybrid DAP is necessary in order to stably determine the part of the hybrid DAP which is active after the condition change—optionally, further integrations are also necessary here (FIG. 1c))—when an intermediate step is computed, as is shown in FIG. 1, a third evaluation within one time step is necessary. This is altogether the problem in the real time computation of hybrid DAPs. The added computation effort for a condition change can easily lead to a multiplication of the computation time of the hybrid DAP so that the required time for computation exceeds a sampling interval and thus the hybrid DAP can no longer be computed under real time conditions.

FIG. 2 shows a method for real time computation of the state variables of a hybrid DAP which is known from the prior art by a flow chart. If an active part of the hybrid DAP is determined, this part of the hybrid DAP ($DAP_{old}$) is computed with a conventional integrator functionality (integrator). The integrator shown in the uppermost block in FIG. 2 works with all equations of the hybrid DAP, except with the equations by means of which a structure change is detected. Therefore, only the parts of the hybrid DAP which are recognized as active are computed by the integrator. In the subsequent method step—condition change?—the condition equations are evaluated which show the change of a structure decision variable. Here, it is conventionally a matter of the detection of a zero crossing of a condition equation. If a condition change is not detected, the integrator functionality which is shown uppermost in the form of the integrator based on the part of the hybrid DAP which is invariably active computes the state variables of the hybrid DAP for the next sampling step in the real time computation. In this computation loop, the integrator functionality is called up once in each computation step.

However, if a condition change is detected, the exact computation of the instant $t_c$ of the zero crossing—=?—of the condition equation and the computation of the part of the hybrid DAP which is active beforehand takes place at this instant ($DAP_{old}(t_c)$) so that the integrator functionality in the case of a condition change, here, is used a further time. Ultimately, in the lowermost block, that set of stable structure decision variables—symbolized by s—which is active in the future is determined by the consistency detection functionality, this consistency detection functionality having to go back to all equations of the hybrid DAP, therefore also the condition equations. Here, consequently, the hybrid DAP is computed at least one further time, possibly here iterations also in turn—therefore multiple computations of the hybrid DAP are necessary to determine a stable set of structure decision variables—$s_n=s_{n-1}$—. The result of the consistency detection functionality can be that a new effective part of the hybrid DAP results ($DAP_{new}$) which, however, need not be so. It becomes clear again that, in the case of a condition change, the computation time can rise dramatically, specifically can exceed by several times the computation time for a single computation step without the condition change.

Figure 3:
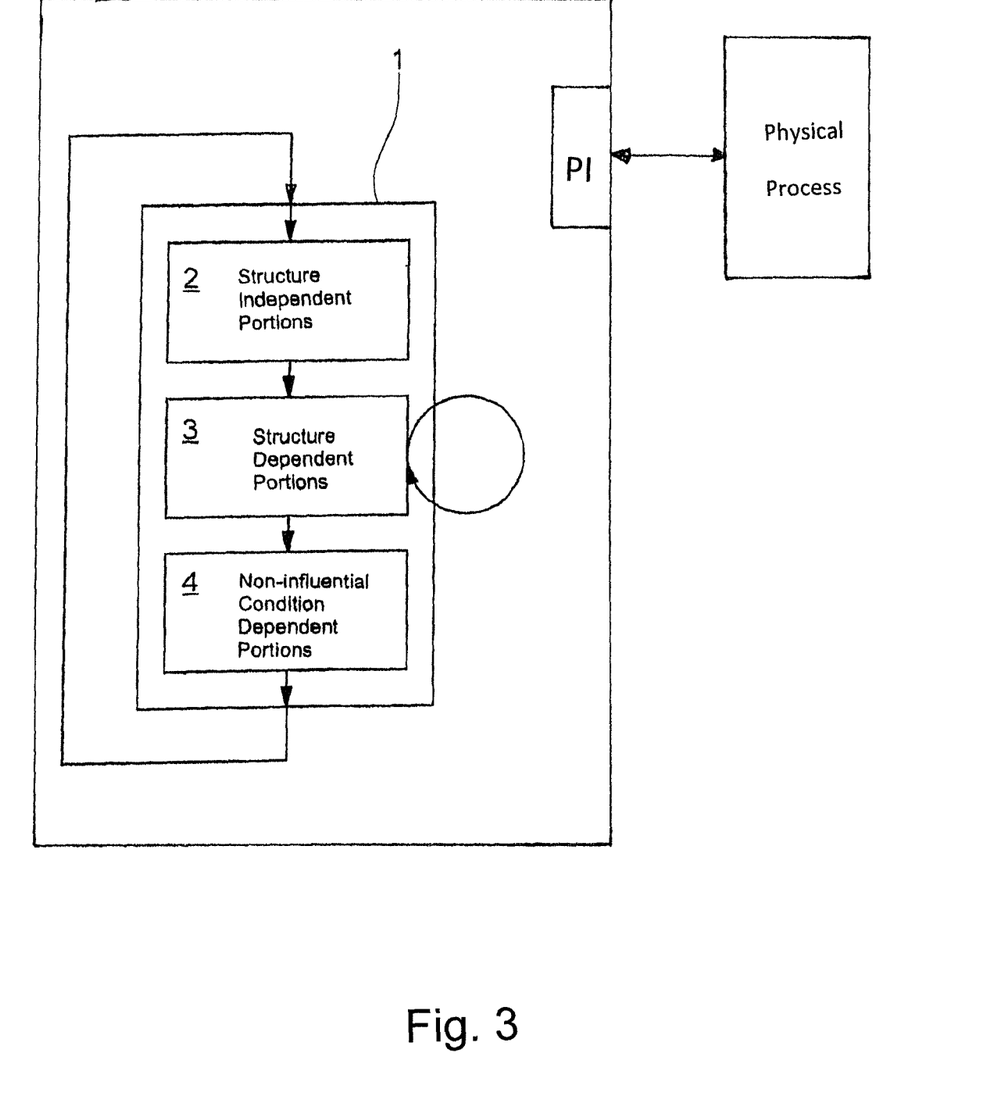
FIG. 3 shows the flow chart for computing the state variables of a hybrid DAP according to the method in accordance with the invention.

Finally, FIG. 3 shows the methods in accordance with the invention for real time computation of the state variables of a hybrid DAP. The separation known from the prior art between integrator functionality, condition evaluation functionality and consistency detection functionality has been broken here. The method is based first on the consistency detection functionality being executed in a common, sorted consistency handling function (KHF) 1, the sorting being chosen so skillfully that for the case of a condition change within the hybrid DAP altogether smaller computation times are necessary to determine and compute the consistent set of structure decision variables of the hybrid DAP.

For this purpose, it is intended that the sorted consistency handling function 1 be divided into a total of three parts 2, 3, 4. The first part 2 of the sorted consistency handling function 1 comprises all structure-independent portions of the hybrid DAP. These portions of the hybrid DAP therefore must always be computed regardless of which parts of the hybrid DAP are active and which values the individual structure decision variables have. The computation of these structure-independent portions of the hybrid DAP is therefore always necessary.

Furthermore, it is provided that a second part 3 of the sorted KHF comprise all condition-dependent portions of the hybrid DAP which in turn influence structure decision variables. Since there can only be influence on the structure decision variables in this second part 3 of the sorted KHF 1, only this second part 3 is also of interest for finding a stable set of values for the structure decision variables.

Ultimately, in a third part 4 of the sorted KHF 1, all condition-dependent portions of the hybrid DAP are encompassed which do not influence any structure decision variables, so that the computation of the parts of the process model which are contained in this third part 4 are not important if a consistency detection functionality is carried out, since the result of this computation does not have any effect on possible structure decision variables.

The illustrated sorting of the hybrid differential-algebraic process model has the advantage that, in the case of a condition change within the hybrid DAP, for detecting the stable set of structure decision variables, the first part 2 and the third part 4 of the sorted KHF 1 need only be computed once. The second, generally—in any case measured on the complete hybrid DAP—very small part 3 of the structured KHF 1 is optionally executed several times in the case of a condition change until a consistent and stable value occupancy for the structure decision variables has been found. It is immediately illuminating that with the sorted KHF, 1 at the same time, also the integrator functionality must always be carried out or the sorted KHF 1 is carried out with each execution of the integrator functionality.

As can be recognized in FIG. 3, there are no longer any case differences in the computation with respect to the detection or non-detection of a condition change; all computation steps are always carried out. Thus, altogether the basic computation load in the method shown in FIG. 3 is higher than in the case of known methods when a condition change does not appear, but for this purpose, the increase in the computation time, even viewed in absolute terms, when a condition change is present are much smaller than is the case in the classic method, because to find the new stable and consistent value set for the structure decision variable only the second part 3 of the sorted consistency handling function 1 need be computed which, for its part, comprises only a selected part of the hybrid DAP at all, and therefore, is less computation-intensive than the computation of the consistency detection functionality in known methods, which is carried out in each iteration based on the complete hybrid DAP within which all equations of the hybrid DAP are therefore computed, including the condition equations for the presence of a condition change.

Figure 4:
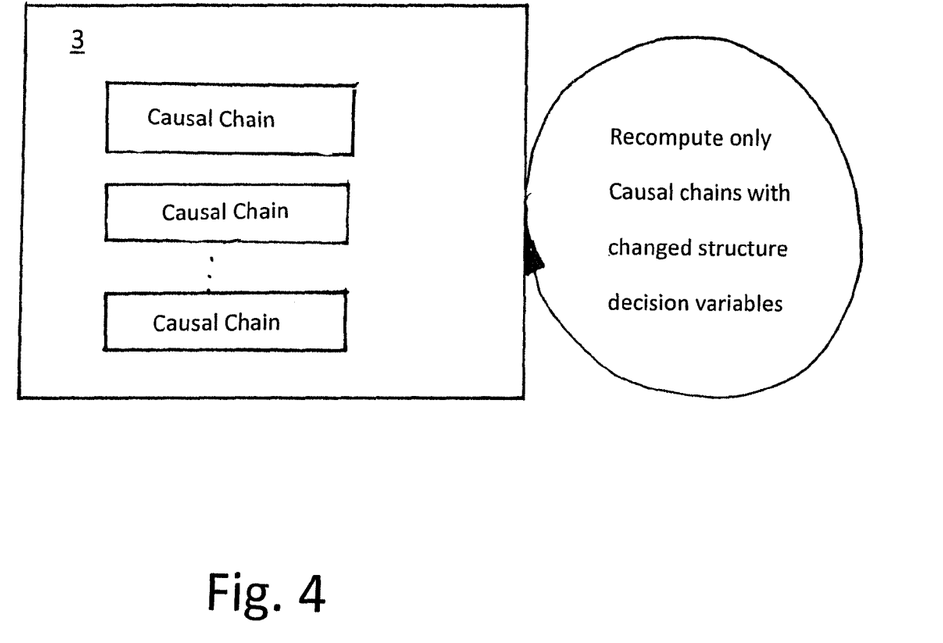
FIG. 4 is an enlarged representation of block 3 of FIG. 3.

According to one preferred configuration of the method in accordance with the invention shown in FIG. 4, in the second part of the sorted consistency handling function, the portions of the hybrid DAP are divided into causal chains of structure decision variables. This means that, when a certain structure decision variable changes, only those parts of the hybrid DAP or the other condition equations are evaluated on which this change of the structure decision variable has any effect at all. In this way, causal chains are formed so that only those causal chains are recomputed in which structure decision variables have changed. Because, when the sorted consistency handling function is carried out, iteration is done at this point only over a still more special and thus smaller part, so that a still greater time gain compared to conventional methods is achieved.

As noted above in the Background portion of this specification, the hybrid differential-algebraic process model can be a motor with a gear train, different gear stages being different structures of the hybrid DAP, of which, only one gear stage can be active, and the structure decision variables, in such a case, can be dependent at least one of engine speed, power demands of the driver and mechanical load on a transmission.

What is claimed is:

1. A method for controlling the performance of a simulator device simulating at least one physical process, comprising the steps of:
    detecting, by a computing device, at least one operating condition represented by a process variable of the at least on physical process being simulated,
    solving, with the computing device and based on the at least one process variable detected, a hybrid differential-algebraic process model using an integrator functionality, a condition evaluation functionality, a consistency detection functionality for structure decision variables, wherein a hybrid differential-algebraic process model is structurally variant depending on the structure decision variables of the process model so that different parts of the hybrid DAP are activated or deactivated so that a specific mode of the hybrid DAP is less complex than a hybrid DAP which is omnipotent and encompasses all possible modes and depending on whether a condition change is detected by the consistency detection functionality, variable parts of the hybrid differential-algebraic process model being active or inactive, wherein the consistency detection functionality is sequentially carried out using a sorted consistency handling function, first part of the sorted consistency handling function comprising all condition-independent portions of the hybrid differential-algebraic process model, second part of the sorted consistency handling function comprising all condition-dependent portions of the hybrid differential-algebraic process model which influence structure decision variables, and third part of the sorted consistency handling function comprising all condition-dependent portions of the hybrid differential-algebraic process model which do not influence the structure decision variables, wherein the second part of the sorted consistency handling function is carried out after the first part of the sorted consistency handling function is carried out, and wherein the third part of the sorted consistency handling function is carried out after the second part of the sorted consistency handling function is carried out, wherein, in the case of a condition change of at least one structure decision variable, for detection of a consistent set of structure decision variables, the first and third parts of the sorted consistency handling function are carried out only once and only the second part of the consistency handling function is carried out repeatedly, wherein the sorted consistency handling function is carried out with each execution of the integrator functionality, and outputting information regarding the solved hybrid differential-algebraic process model from the computing device and controlling the performance of the simulator based on the outputted information so as simulate a corresponding operating condition, and wherein the information regarding the solved hybrid differential-algebraic process model includes state variables of the hybrid differential-algebraic process model.

2. Method as claimed in claim 1, wherein, in the second part of the sorted consistency handling function, portions of the hybrid differential-algebraic process model are divided into causal chains of structure decision variables, and only those causal chains are recomputed in which structure decision variables have changed.

* * * * *